United States Patent
James et al.

(10) Patent No.: US 10,893,632 B2
(45) Date of Patent: Jan. 12, 2021

(54) EQUIPMENT ENCLOSURE FREE-AIR COOLING ASSEMBLY WITH INDEXING PRE-SCREEN

(71) Applicant: Diversified Control, Inc., Orchard Park, NY (US)

(72) Inventors: Brent A. James, Orchard Park, NY (US); Lewis G. James, Clarence, NY (US); Aron J. King, Alden, NY (US)

(73) Assignee: Diversified Control, Inc., Orchard Park, NY (US)

( * ) Notice: Subject to any disclaimer, the term of this patent is extended or adjusted under 35 U.S.C. 154(b) by 498 days.

(21) Appl. No.: 15/593,469

(22) Filed: May 12, 2017

(65) Prior Publication Data

US 2018/0332737 A1    Nov. 15, 2018

(51) Int. Cl.
*H05K 7/20*    (2006.01)

(52) U.S. Cl.
CPC ....... *H05K 7/20581* (2013.01); *H05K 7/2059* (2013.01); *H05K 7/20181* (2013.01)

(58) Field of Classification Search
CPC ........... H05K 7/20581; H05K 7/20181; H05K 7/2059
USPC ...................................................... 454/184
See application file for complete search history.

(56) References Cited

U.S. PATENT DOCUMENTS

| | | |
|---|---|---|
| 4,338,996 A | 7/1982 | Frank |
| 4,386,651 A | 6/1983 | Reinhard |
| 4,449,579 A | 5/1984 | Miyazaki et al. |
| 5,738,166 A | 4/1998 | Chou |
| 5,765,743 A | 6/1998 | Sakiura et al. |
| 5,832,988 A | 11/1998 | Mistry et al. |
| 5,886,296 A | 3/1999 | Chorbani et al. |
| 5,934,368 A | 8/1999 | Tanaka et al. |
| 6,026,891 A | 2/2000 | Fujiyoshi et al. |
| 6,041,851 A | 3/2000 | Diebel et al. |
| 6,067,223 A | 5/2000 | Diebel et al. |
| 6,105,875 A | 8/2000 | LaGrotta et al. |
| 6,119,768 A | 9/2000 | Dreier et al. |
| 6,123,266 A | 9/2000 | Bainbridge et al. |
| 6,127,663 A | 10/2000 | Jones |
| 6,164,369 A | 12/2000 | Stoller |
| 6,407,533 B1 | 6/2002 | Bartek et al. |

(Continued)

FOREIGN PATENT DOCUMENTS

JP    2012151298 A  *  8/2012  ............... H04N 5/64

OTHER PUBLICATIONS

Dantherm Heat Management Systems, "Indoor/Outdoor Heat Exchangers", Jan. 1, 2008, 2 pages.

(Continued)

*Primary Examiner* — Edelmira Bosques
*Assistant Examiner* — Dana K Tighe
(74) *Attorney, Agent, or Firm* — Walter W. Duft

(57) ABSTRACT

An equipment enclosure free air cooling assembly includes an air outlet arranged to deliver air to inside an equipment enclosure and an air inlet arranged to receive air from outside the equipment enclosure. An air flow pathway is provided through which air entering the air inlet must pass to reach the air outlet. An adjustable screen assembly has a screen filter element. An adjustment mechanism is operable to selectively utilize different regions of the screen filter element for filtering air passing through the air flow pathway at different times.

21 Claims, 5 Drawing Sheets

(56) References Cited

U.S. PATENT DOCUMENTS

| | | |
|---|---|---|
| 6,533,031 B1 | 3/2003 | Garcia et al. |
| 6,579,168 B1 | 6/2003 | Webster et al. |
| 6,598,668 B1 | 7/2003 | Cosley et al. |
| 6,628,520 B2 | 9/2003 | Patel et al. |
| 6,700,780 B2 | 3/2004 | Hedberg et al. |
| 6,704,198 B2 | 3/2004 | Replogle et al. |
| 6,742,583 B2 | 6/2004 | Tikka |
| 6,877,551 B2 | 4/2005 | Stoller |
| 6,885,554 B1 | 4/2005 | Reeck et al. |
| 6,889,752 B2 | 5/2005 | Stoller |
| 6,936,372 B1 | 8/2005 | Jagota et al. |
| 7,180,738 B2 | 2/2007 | Mandel et al. |
| 7,222,660 B2 | 5/2007 | Giacoma et al. |
| 7,309,279 B2 | 12/2007 | Sharp et al. |
| 7,312,993 B2 | 12/2007 | Bundza et al. |
| 7,455,706 B2 | 11/2008 | Latham et al. |
| 7,929,294 B2 | 4/2011 | Yeh et al. |
| 7,974,094 B2 | 7/2011 | Hendrix et al. |
| 8,072,752 B2 | 12/2011 | Wantschik |
| 8,072,780 B1 | 12/2011 | Roy |
| 8,251,136 B2 | 8/2012 | Shibata et al. |
| 8,313,038 B2 | 11/2012 | Therrien et al. |
| 8,408,356 B2 | 4/2013 | Yamaguchi et al. |
| 2002/0167797 A1 | 11/2002 | Willers et al. |
| 2007/0289976 A1 | 12/2007 | Meyer et al. |
| 2008/0055849 A1 | 3/2008 | Lee |
| 2008/0068798 A1 | 3/2008 | Hendrix et al. |
| 2008/0112135 A1 | 5/2008 | Kleinecke et al. |
| 2008/0212286 A1 | 9/2008 | Komatsu |
| 2008/0239668 A1 | 10/2008 | Hendrix et al. |
| 2009/0020618 A1 | 1/2009 | Gutierrez et al. |
| 2009/0311951 A1 | 12/2009 | Walkinshaw |
| 2010/0206065 A1 | 8/2010 | Hsiao et al. |
| 2011/0086589 A1 | 4/2011 | Skrepcinski et al. |
| 2013/0035031 A1 | 2/2013 | Therrien et al. |

OTHER PUBLICATIONS

Dionx Air Quality Systems, "Cooling Systems for Telecoms Applications", Jan. 1, 2015, 1 page.

Dionx Air Quality Systems, "FC Range Free Air Cooling Systems", at least as early as May 11, 2017, 2 pages.

Dantherm Heat Management Systems, "Flexibox Free Cooling", at least as early as May 11, 2017, 2 pages.

\* cited by examiner

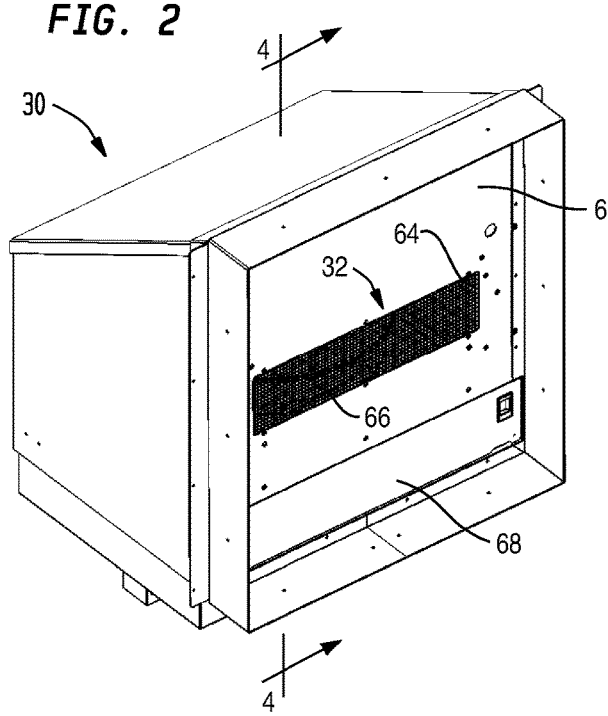
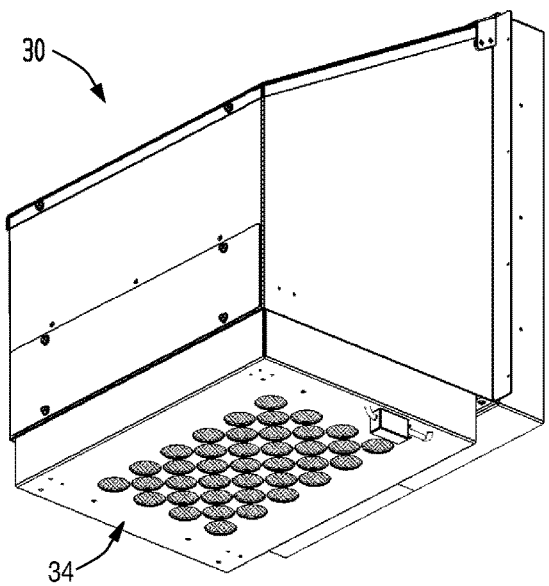
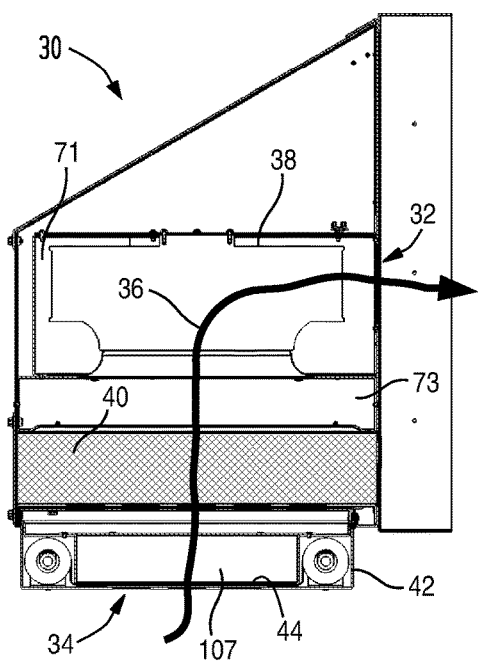
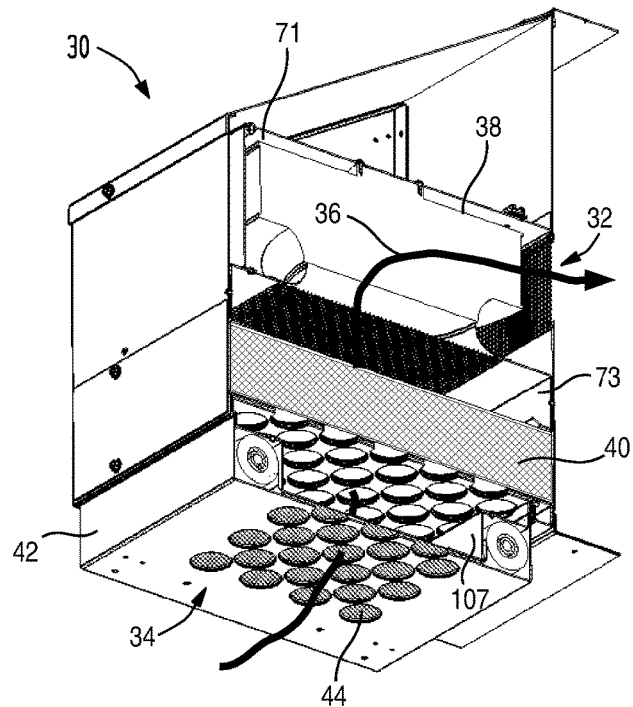

EQUIPMENT ENCLOSURE FREE-AIR COOLING ASSEMBLY WITH INDEXING PRE-SCREEN

BACKGROUND

1. Field of the Disclosure

The present disclosure relates to equipment enclosures. More particularly, the disclosure concerns enclosures with temperature control apparatus for maintaining temperature controlled equipment within a desired temperature range. Still more particularly, the disclosure is directed to an equipment enclosure free air cooling assembly

2. Description of the Prior Art

By way of background, equipment enclosures are often used to house temperature controlled equipment that is designed to operate most efficiently within a prescribed temperature range. Examples include, but are not limited to, outdoor enclosures for cellular communications equipment and other apparatus. Such equipment enclosures often include some type of free-air circulation system to bring in fresh air from outside the enclosure to help maintain the temperature controlled equipment within the desired temperature range. Existing air circulation systems typically include filters to remove dust and particulates from the circulated air in order to maintain a clean environment within the equipment enclosure. As an air filter accumulates trapped dust, dirt, insect remnants and other debris, it becomes dirty and less efficient. Most air filters are therefore removable so they can be periodically replaced or cleaned. An air filter's replacement/cleaning schedule depends on various factors, including the design of the filter and the quality of the air being filtered. Because equipment enclosures may be situated in areas that are not conveniently accessible, such as remote outdoor locations, it is generally desirable to extend air filter service life as long as possible.

It is to improvements in equipment enclosure air filtering that the present disclosure is directed. In particular, it would be desirable to provide a technical advance that extends useful air filter life so that the need for filter servicing is less frequent. A technical advance that improves air quality by providing some measure of secondary air filtering would also be desirable.

SUMMARY

An equipment enclosure free air cooling assembly includes an air outlet arranged to deliver air to inside an equipment enclosure and an air inlet arranged to receive air from outside the equipment enclosure. An air flow pathway is provided through which air entering the air inlet must pass to reach the air outlet. An adjustable screen assembly has a screen filter element. An adjustment mechanism is operable to selectively utilize different regions of the screen filter element for filtering air passing through the air flow pathway at different times.

In an embodiment, the different regions of the screen filter element include at least a first screen region for filtering during a first time period and a second screen region for filtering during a second time period.

In an embodiment, the different regions of the screen filter element are selectively utilizable for filtering the air by virtue of the different regions being movable in and out of the air flow pathway.

In an embodiment, the different regions of the screen filter element are movable by virtue of the adjustable screen assembly being indexable.

In an embodiment, the adjustable screen assembly includes the screen filter element being mounted on a pair of rollers.

In an embodiment, the adjustable screen assembly comprises a source roller having a first portion of the screen filter element wound thereon and a take-up roller having a second portion of the screen filter element wound thereon.

In an embodiment, the source roller and the take-up roller are spaced from each other to define a screen-filtering area wherein a third portion of the screen filter element spans the air-flow pathway.

In an embodiment, the adjustment mechanism includes a drive mechanism operable to rotate the take-up roller.

In an embodiment, the adjustable screen assembly includes a screen tensioner operable to tension the third portion of the screen filter element.

In an embodiment, an air filter element is disposed in the air flow pathway downstream of the screen filter element.

BRIEF DESCRIPTION OF THE DRAWINGS

The foregoing and other features and advantages will be apparent from the following more particular description of example embodiments, as illustrated in the accompanying Drawings, in which:

FIG. 2 is a front perspective view showing an example free air cooling assembly that may be used with the equipment enclosure of FIG. 1;

FIG. 3 is a rear perspective view showing the free air cooling assembly of FIG. 2;

FIG. 4 is a cross-sectional elevation view of the free air cooling assembly of FIG. 2 showing a vertical cross-section taken along line 4-4 in FIG. 2;

FIG. 5 is a cross-sectional perspective viewing showing the vertical cross-section of FIG. 4;

DETAILED DESCRIPTION OF EXAMPLE EMBODIMENTS

Figure 1:
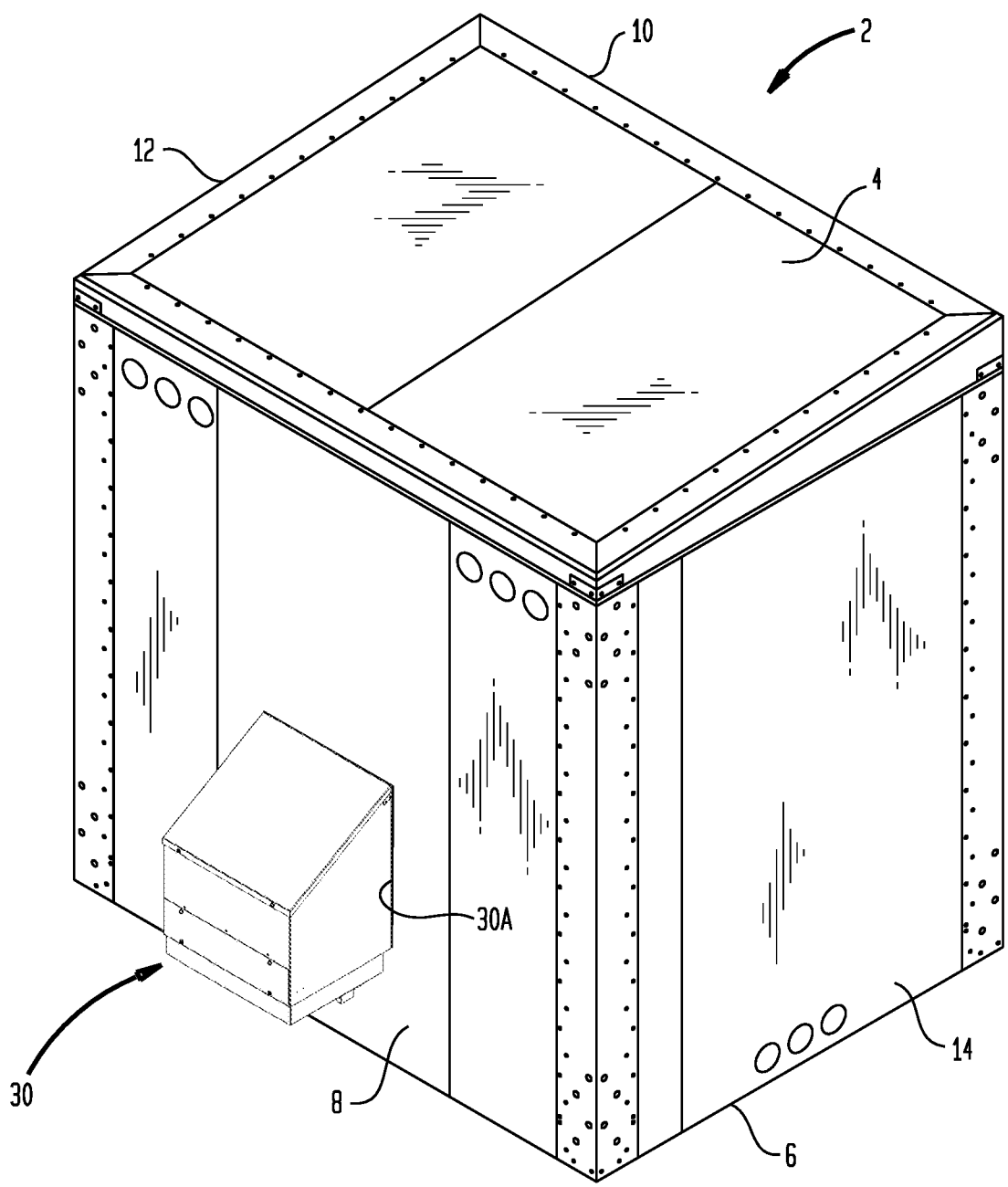
FIG. 1 is a rear perspective view showing an example equipment enclosure that may be constructed according to the present disclosure.

Turning now to the drawing figures, which are not necessarily to scale, like reference numerals are used to represent like elements in all of the several views. FIG. 1 illustrates one example embodiment of an equipment enclosure 2 that may be constructed in accordance with the present disclosure. The equipment enclosure 2 may be designed for either indoor or outdoor applications. In the illustrated embodiment of FIG. 1, the equipment enclosure 2 is depicted as a large walk-in unit that is suitable for housing telecommunications equipment, such as may be found at a cellular telephone communications site. However, the size and intended purpose of the equipment enclosure 2 are largely irrelevant to the present disclosure, and are mentioned merely for purposes of example only.

Depending on the end use application, the equipment enclosure 2 may be fabricated from a metal such as steel or aluminum, a non-metal such as a thermoplastic polymer, or any other suitable material. In the illustrated embodiment of FIG. 1, the equipment enclosure is configured with a top panel 4, a bottom panel 6, and four side panels (consisting of a rear side 8, a front side 10, a left side 12, and a right side 14) that define an interior equipment chamber that houses electronic equipment (not shown). Some or all of the electronic equipment housed within the equipment chamber may be controlled temperature equipment. As used herein, "controlled temperature equipment" refers to any equipment, device or component that is sensitive to temperature and therefore needs to be maintained in a controlled temperature environment. Various temperature control systems may be used with the equipment enclosure 2 to ensure that the controlled temperature equipment within the enclosure is maintained within a desired temperature range. One such system is a free air cooling assembly 30, which is designed to bring fresh outside air into the interior equipment chamber for cooling purposes. In the illustrated embodiment of FIG. 1, the free air cooling assembly 30 is shown as being mounted on the rear side panel 8. In particular, the free air cooling assembly 30 is fitted in a corresponding opening 30A of the rear side panel 8. For other types of equipment enclosure, it may be desirable to mount the free air cooling assembly 30 at some other location, such as on a different side of the enclosure, on a service door of the enclosure, on the roof of the enclosure, etc. Some or all of the free air cooling assembly 30 could also be situated inside the equipment enclosure 2, so long as the free air cooling assembly is able to draw in ambient air from outside the equipment enclosure. Thus, the free air cooling assembly mounting location depicted in FIG. 1 is illustrated for purposes of example only.

With additional reference now to FIGS. 2-5, the free air cooling assembly 30 includes an air outlet 32 (see FIG. 2) arranged to deliver air to inside the equipment enclosure 2, and an air inlet 34 (see FIG. 3) arranged to receive ambient air from outside the equipment enclosure. As can be seen in FIGS. 4 and 5, an air flow pathway 36 is provided through which air entering the air inlet 34 must pass to reach the air outlet 32. Outside air is pulled through the air flow pathway 36 by an air mover 38 that may, for example, be implemented as a motor-driven centrifugal fan. The output of the air mover 38 is adjacent to the air outlet 32. The input of the air mover 38 is above and downstream from a primary air filter element 40 that filters all air passing through the free air cooling assembly 30. Below and upstream of the air filter element 40 is an adjustable screen assembly 42 that screens outside air entering the air inlet 34. The adjustable screen assembly 42 includes a screen filter element 44 for removing large particulates, including insects and other debris, from the incoming air before it reaches the primary air filter element 40. The adjustable screen assembly 42 may thus be thought of a performing a secondary filtering or pre-screening function.

As described hereinafter, the adjustable screen assembly 42 includes an adjustment mechanism that is operable to selectively utilize different regions of the screen filter element 44 for filtering air passing through the air flow pathway 36 at different times. In the event that one region of the screen filter element 44 becomes dirty, the adjustment mechanism may be activated to relocate active air filtering to a different region of the screen filter element 44. This can help extend the useful service life of the primary air filter 40 because the screen assembly's pre-screening capability (which reduces debris loading on the primary air filter) can be periodically rejuvenated.

Figure 6:
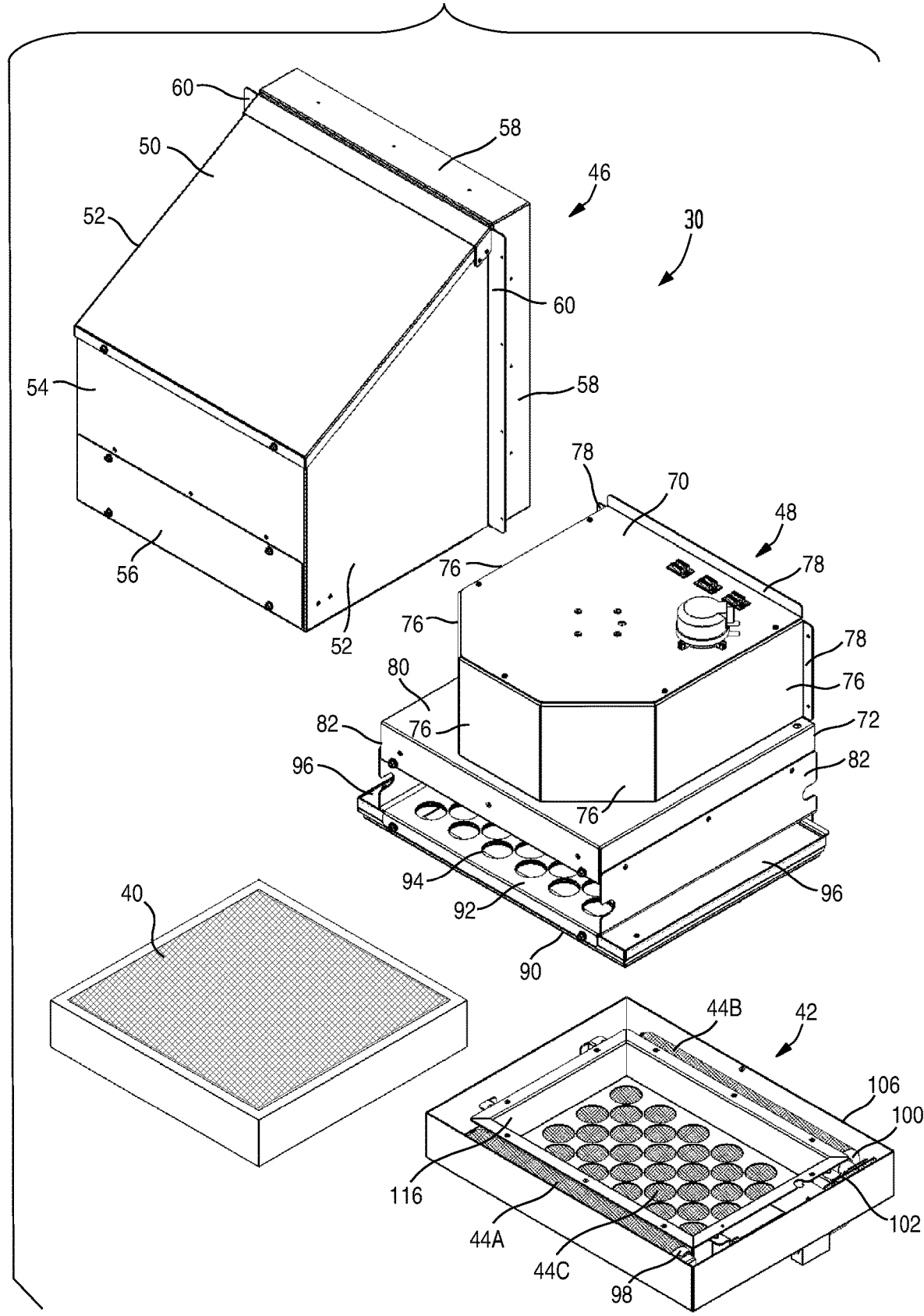
FIG. 6 is an exploded rear perspective view showing an example cover assembly, an example fan-and-filter housing assembly, an example air filter, and an example adjustable screen assembly of the free air cooling assembly of FIG. 2.

Turning now to FIG. 6, example internal components of the free air cooling assembly 30 of the illustrated embodiment are shown in more detail. These components include a cover assembly 46, a fan-and-filter housing assembly 48, the previously-mentioned primary air filter 40, and the previously-mentioned adjustable screen assembly 42.

The cover assembly 46 may be implemented in various configurations and constructed of various materials. In the illustrated embodiment, the cover assembly 46 is made of sheet metal and includes a top panel 50 that slopes to facilitate rain and snow drainage, a pair of side panels 52, a fixed rear panel 54, and a removable rear access panel 56 through which the primary air filter 40 may be inserted and removed. A short front-side plenum 58 may be provided to prevent air leakage around the opening 30A of the equipment enclosure 2. A pair of front-side mounting flanges 60 may be provided for attaching the free air cooling assembly 30 once it is installed in the opening 30A. As may be additionally seen in FIG. 2, the cover assembly 46 may further include a front panel 62 that may be in co-planar alignment with the mounting flanges 60. The front panel 62 may be formed with an opening 64 that defines the air outlet 32 of the free air cooling assembly 30. The opening 64 may be covered with a fixed screen element 66. A removable access panel 68 may also be provided on the front side of the cover assembly 46 so that the primary air filter 40 can be inserted and removed from inside the equipment enclosure 2. Although not shown, the bottom of the cover assembly 46 is open in order to receive the components of the fan-and-filter housing assembly 48 when the cover assembly is placed thereon.

Figure 7:
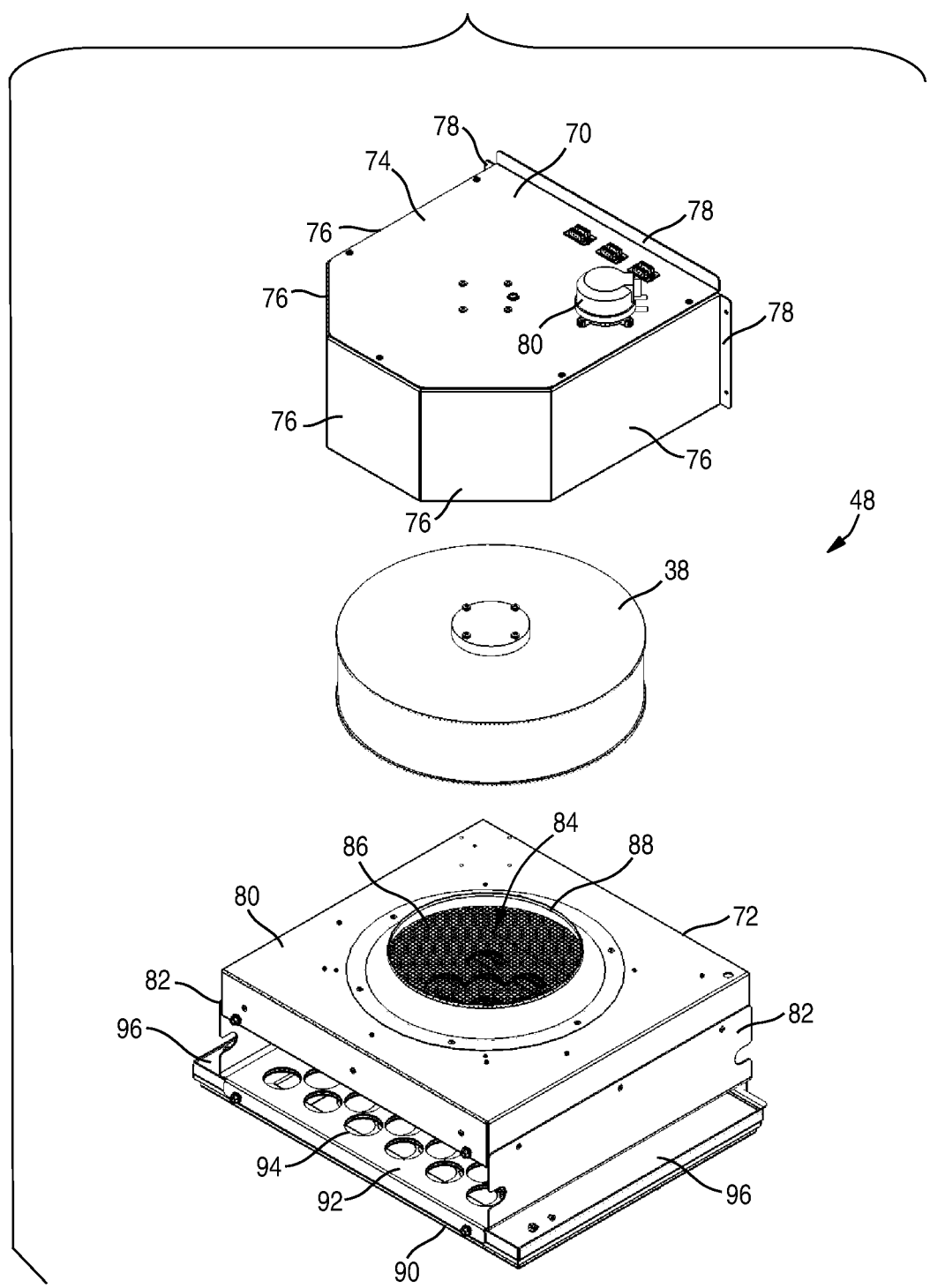
FIG. 7 is an exploded rear perspective view showing example components of the fan-and-filter housing assembly of FIG. 6.

With additional reference now to FIG. 7, the fan-and-filter housing assembly 48 may include a fan housing 70, the previously described centrifugal fan 38, and a filter housing 72. The fan housing 70 may be implemented in various configurations and constructed of various materials. In the illustrated embodiment, the fan housing 70 is made of sheet metal and defines an enclosed upper plenum portion 71 (see FIGS. 4 and 5) of the air flow pathway 36. The fan housing 70 is sized and shaped to receive the centrifugal fan 38 therein. It may include an upper panel 74 and a set of side and rear panels 76 that close off three sides of the fan exhaust. Front mounting flanges 78 may be provided for attaching the fan housing 70 to the front panel 62 (see FIG. 2) of the cover assembly 46. A pressure-actuated fan control switch 80 may be mounted on the upper panel 74. The bottom of the fan housing 70 is open in order to receive the centrifugal fan 38 therein. The front of the fan housing 70 is open in order to direct the fan exhaust toward the air outlet 32 of the free air cooling assembly 30.

With continuing reference to FIGS. 6 and 7, the filter housing 72 may be implemented in various configurations and constructed of various materials. In the illustrated embodiment, the filter housing 70 is made of sheet metal and defines an enclosed medial plenum portion 73 (see FIGS. 4 and 5) of the air flow pathway 36. The filter housing 72 is sized and shaped to receive the primary air filter 40 therein. It may include an upper panel 80 and a set of side panels 82. The upper panel 80 has a central opening 84 through which air exiting from the primary air filter 40 is directed to the inlet side of the centrifugal fan 38. The central opening 84 may be covering by a fixed screen element 86. A raised fan mounting shroud 88 may be situated at the central opening 84 for mounting the centrifugal fan 38. A generally flat base panel assembly 90 forms the bottom of the filter housing assembly 72. A central portion 92 of the base panel assembly 90 lies between the side panels 82. The central portion 92 is formed with plural openings 94 that allow air exiting the screen filter assembly 42 to enter the primary air filter 40. Lateral portions 96 of the base panel assembly 90 lie outside of the side panels 82. The lateral portions 96 provide mounting surfaces for attaching the fan-and-filter housing assembly 48 to the bottom of the cover assembly 46 (see FIG. 6). The front and back sides of the filter housing 72 are open to allow the primary air filter 40 to be inserted and removed therethrough.

With additional reference to FIG. 8, the adjustable screen assembly 42 will now be described. As previously noted, the adjustable screen assembly 42 includes a screen filter element 44 that includes different screen regions for filtering air passing through the air flow pathway 36 at different times. As described in more detail below, the different screen regions of the screen filter element 44 may include at least first and second regions, and preferably more. In the illustrated embodiment of FIG. 8, the different screen regions of the screen filter element 44 are selectively utilizable for filtering the air by virtue of the different regions being movable in and out of the air flow pathway 36. Screen movement may be achieved by virtue of the adjustable screen assembly 42 having a screen-indexing adjustment mechanism that may include a source roller 98, a take-up roller 100 and a drive mechanism 102.

The screen filter element 44 may be provided as single elongated sheet of screen element material that is mounted on the source and take-up rollers 98 and 100. As can be seen in FIG. 8, the source roller 98 may have a first portion 44A of the screen filter element 44 wound thereon. The take-up roller assembly 100 may have a second portion 44B of the screen filter element 44 wound thereon. The source roller 98 and the take-up roller 100 are spaced from each other to define a screen-filtering area 104 wherein a third portion 44C of the screen filter element 44 spans the air-flow pathway 36. The screen portion 44C that spans the screen-filtering area 104 may be thought of as representing the above-mentioned first screen region for filtering air during a first time period. The screen portion 44A that is wound on the source roller 98 may be thought of as including at least a second screen region for filtering air during a second time period. Depending on the amount of screen material wound on the source roller 98, the screen portion 44A may include one or more additional screen regions for filtering air during one or more additional time periods. It will be appreciated that the screen portion 44B that is wound on the take up roller 98 may itself include zero or more screen regions that were utilized for filtering air during zero or more previous time periods.

Figure 8:
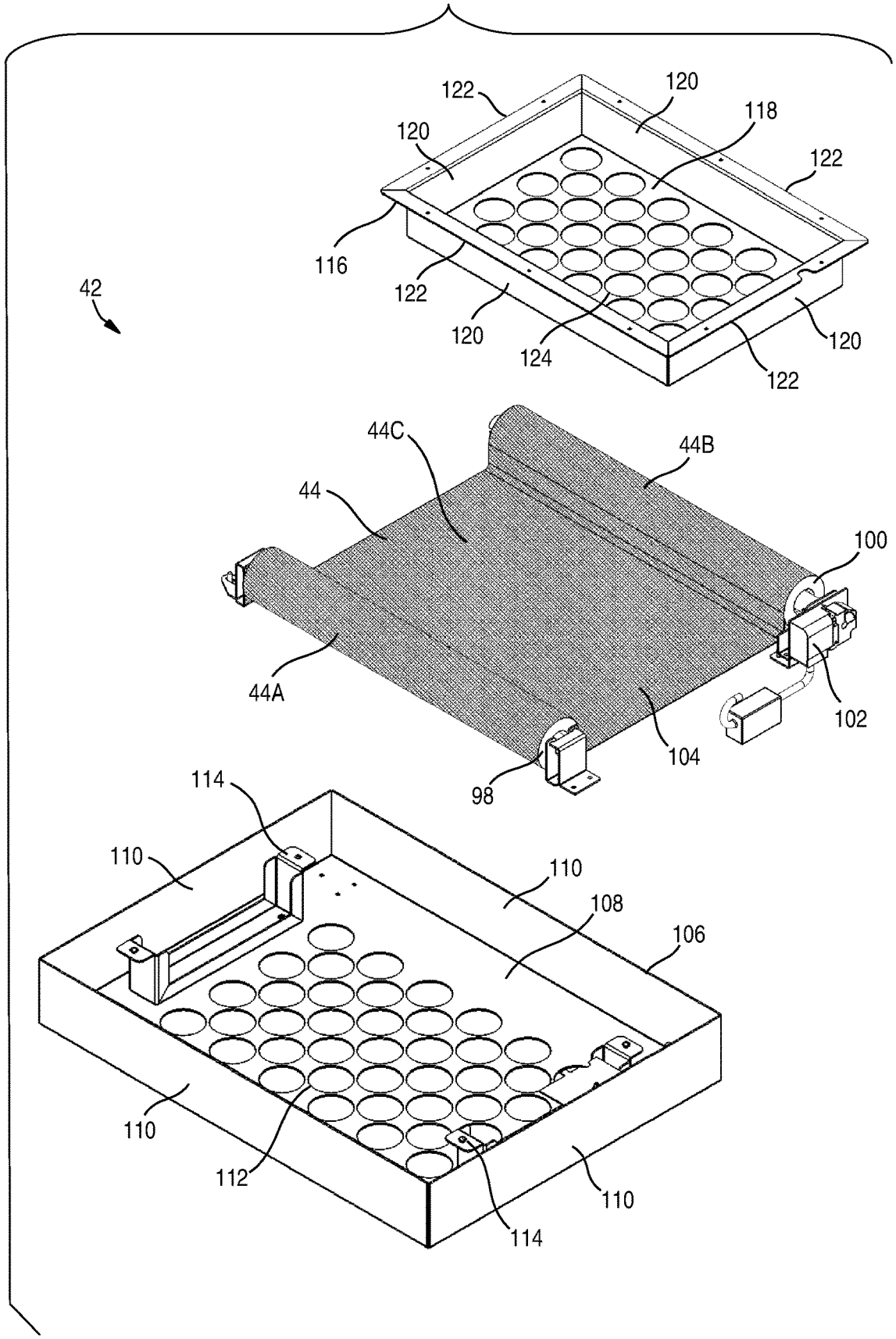
FIG. 8 is an exploded rear perspective view showing example components of the adjustable screen assembly of FIG. 6.

In the illustrated embodiment of FIG. 8, the drive mechanism 102 may be implemented as an indexing drive motor, such as stepper motor, that is operable to rotate the take-up roller 100 in a controlled manner and thereby advance a precise amount of the screen filter element 44. Advancing the screen filter element 44 will result in the screen portion 44C that currently spans the screen-filtering area 104 being wound onto the take-up roller 100, thereby becoming part of the screen portion 44B. At the same time, some of the screen portion 44A that was previously wound on the source roller 98 will be payed out across the screen-filtering area 104, thereby becoming the new screen portion 44C that performs active filtering.

As further shown in FIG. 8, the screen element 44, the source and take-up rollers 98 and 100, and the drive mechanism 102 may be mounted on a base tray 106. The base tray 106 may be implemented in various configurations and constructed of various materials. In the illustrated embodiment, the base tray 106 is made of sheet metal and defines an enclosed lower plenum portion 107 (see FIGS. 4 and 5) of the air flow pathway 36. The base tray 106 is sized and shaped to engage the bottom of the filter housing assembly 72 (see FIG. 6). The base tray 106 may include a lower panel 108 and a set of side panels 110. The lower panel 108 supports the lower side of the screen filter element 44, across the screen-filtering area 104 (i.e., screen portion 44C), and is formed with a plurality of air flow openings 112 that collectively define the air inlet 34 of the free air cooling assembly 30. A pair of brackets 114 may be provided for attaching a screen tensioner component of the adjustable assembly 42, as will now be described.

The screen tensioner is shown by reference number 116 in FIG. 8. It is operable to tension the screen filter element 44 across the screen-filtering area 104 (i.e., screen portion 44C). The screen tensioner 116 may be implemented in various configurations and constructed of various materials. In the illustrated embodiment, the screen tensioner 116 is made of sheet metal and is sized and shaped to substantially cover the entire expanse of the screen portion 44C. It may include a lower panel 118, a set of side panels 120, and an upper peripheral flange 122. The lower panel 118 contacts the upper side of the screen filter element 44, across the screen-filtering area 104 (i.e., screen portion 44C), and is formed with a plurality of air flow openings 124 to facilitate air flow through the screen filter element. The upper flange 122 is used for mounting the screen tensioner 116 to the brackets 114 of the base tray 106. The upper flange 122 also facilitates attachment of the adjustable screen assembly 42 to the panel assembly 90 that forms the bottom of the filter housing assembly 72 (see FIG. 6).

Example operational features of the free air cooling assembly 30 will now be described with reference to FIGS. 4, 5 and 8. Initially, during a first time period, the adjustable screen assembly 42 may be placed in a first adjustment position wherein a first region of the screen filter element 44 spans the screen-filtering area 104 and filters air passing through the air flow pathway 26. After the first time period has elapsed, the drive mechanism 102 of the adjustable screen assembly 42 may be operated to advance the take-up roller 100. This will adjust the screen filter element 44 so as to utilize a second region of the screen filter element in lieu of the first region of the screen filter element. The free air cooling assembly 30 may then be operated during a second time period using the second region of the screen filter element 44 spanning the screen-filtering area 104 to filter air passing through the air flow pathway 26. Once the second time period has passed, the adjustment operation may be repeated to utilize a third region of the screen filter element 44 during a third time period, and so on for as long as there is sufficient screen filter element material remaining to be used.

It will be appreciated that the above-described screen-adjustment operations may be performed periodically so as to index the screen filter element 44 at discrete time intervals, or alternatively, could be performed substantially continuously at a desired screen-indexing speed. It will be further appreciated that as the screen filter element 44 is indexed either periodically or continuously, new screen material will enter the the screen-filtering area 104 from the source roller 44A to form the screen portion 44C while old screen material leaves the screen-filtering area to be wound on the take up roller 44B (see FIG. 8). This effectively changes the screen region being used to filter air passing through the air flow pathway 36 each time the screen filter element 44 is adjusted.

During typical operations, it is contemplated that a single screen adjustment operation will rotate the take up roller 100 (see FIG. 8) by an amount that is sufficient to completely introduce new (previously unused) screen material across the screen filtering area 104 (i.e., screen portion 44C). In that case, the active region of the screen filter element 44 being utilized to filter air will be completely changed as a result of each screen adjustment operation. Alternatively, it is also possible to operate the free air cooling assembly 30 so that a single screen adjustment operation results in only some of the screen portion 44C being replaced with new screen material, such that the screen filtering area 104 consists of both old screen material and new screen material. In that case, the active region of the screen filter element 44 being utilized to filter air will only be partially changed by the screen adjustment operation, but will nonetheless represent a different region of the screen filter element than was utilized prior to the adjustment operation. If continuous screen operations are in effect, which may be desirable for certain applications, the active region of the screen element 44 being utilized to filter air will continuously change over time, with a different region of the screen filter element 44 being utilized at any given moment.

The above-described example screen filter element adjustment operations will typically be performed in automated fashion, but could also be performed manually if so desired. In either case, the length of each time period between successive indexing adjustments of the screen filter element 44 may be selected according to prevailing conditions. For example, adjustments may be performed whenever the currently used portion 44C of the screen filter element 44 becomes dirty enough to warrant a new region of the screen filter element being brought into service. This will largely depend on the quality of the air being drawn into the free air flow assembly 30. If automated adjustment is implemented, one or more sensors may be provided to monitor the condition of the screen portion 44C. Depending on the type of sensor(s), this may be accomplished using optical measurements, air pressure measurements, or otherwise. If desired, sensor readings and other operational data associated with the free air cooling assembly 30 may be collected by an onboard data processing system (not shown) associated with the free air cooling assembly 30 or otherwise provided at the site of the equipment enclosure 2 (e.g., as part of an equipment enclosure control system). The operational data may be stored by an onboard data storage device (not shown) operably coupled to the data processing system. Alternatively, or in addition, the operational data may be relayed via a suitable communications link (e.g., a network link) to a remote data monitoring facility. By way of example only, the operational data could be relayed using a web server (not shown) implemented by the onboard data processing system that communicates with a remote web client. The web server could also be used to receive control inputs from the remote web client, including commands for adjusting the operational parameters of the free air cooling assembly 30.

In an embodiment, the primary air filter 40 may have a nominal service life, based on a manufacturer's recommendation, following which the primary air filter is expected to be replaced or cleaned (depending on the filter type). This nominal service life may be extended due to the free air cooling assembly 30 being equipped with the adjustable screen assembly 42. The adjustable screen assembly 42 will pre-screen the air to remove large particulates, insects and debris that would otherwise be collected by the primary filter 40. The amount of extended service life of the primary air filter 40 that is provided by the adjustable screen assembly 42 may be determined by experiment under various field conditions. The adjustable screen assembly 42 may then be optimized by loading a sufficient amount of screen filter element material onto the source roller 98 to last for the entirety of the primary air filter's extended service life, based on the calculated number of screen adjustments that will be implemented by the adjustable screen assembly 42 during this time period. In this way, service personnel may periodically service both the primary filter 40 and the adjustable screen assembly 42 at the same time. Needless site visits to service one component but not the other may thereby be avoided.

Accordingly, an equipment enclosure free air cooling assembly has been disclosed. Although various embodiments have been described, it should be apparent that many variations and alternative embodiments could be implemented in accordance with the inventive concepts disclosed herein. It will therefore be understood that the invention is not to be in any way limited except in accordance with the spirit of the appended claims and their equivalents.

What is claimed is:

1. An equipment enclosure free air cooling assembly, comprising:
    an air outlet arranged to deliver air that has passed completely through said free air cooling assembly to inside an interior equipment chamber of an equipment enclosure;
    an air inlet arranged to receive said air from outside said equipment enclosure;
    an air flow pathway through which said air entering said air inlet must pass to reach said air outlet;
    a primary air filter removably disposed in said air flow pathway, said primary air filter being configured to filter dust from said air;
    an adjustable screen assembly having a screen filter element disposed upstream of said primary air filter in said air flow pathway;
    an adjustment mechanism operable to selectively utilize different regions of said screen filter element for filtering said air passing through said air flow pathway at different times;
    said screen filter element being a secondary air filter configured to perform pre-screening to remove large particulates from said air before it reaches said primary air filter while passing said dust to said primary air filter, said large particulates being larger in size than said dust filtered by said primary air filter, thereby extending a useful service life of said primary air filter; and
    said free air cooling assembly being operable to receive said air from outside said equipment enclosure into said air inlet, pass said air through said adjustable screen assembly and said primary air filter via said air flow pathway, and deliver said air that has passed through said adjustable screen assembly and said primary air filter through said air outlet to inside said interior equipment chamber.

2. The equipment enclosure free air cooling assembly of claim 1, wherein said different regions of said screen filter element include at least a first screen region for filtering said air during a first time period and a second screen region for filtering said air during a second time period.

3. The equipment enclosure free air cooling assembly of claim 1, wherein said different regions of said screen filter element are selectively utilizable for filtering said air by virtue of said different regions being movable in and out of said air flow pathway.

4. The equipment enclosure free air cooling assembly of claim 1, wherein said different regions of said screen filter element are movable by virtue of said adjustable screen assembly being indexable.

5. The equipment enclosure free air cooling assembly of claim 1, wherein said adjustable screen assembly comprises said screen filter element being mounted on a pair of rollers.

6. The equipment enclosure free air cooling assembly of claim 1, wherein said adjustable screen assembly comprises a source roller having a first portion of said screen filter element wound thereon and a take-up roller having a second portion of said screen filter element wound thereon.

7. The equipment enclosure free air cooling assembly of claim 6, wherein said source roller and said take-up roller are spaced from each other to define a screen-filtering area wherein a third portion of said screen filter element spans said air-flow pathway.

8. The equipment enclosure free air cooling assembly of claim 7, wherein said adjustment mechanism comprises a drive mechanism operable to rotate said take-up roller.

9. The equipment enclosure free air cooling assembly of claim 8, wherein said adjustable screen assembly includes a screen tensioner operable to tension said third portion of said screen filter element.

10. The equipment enclosure free air cooling assembly of claim 9, wherein said screen tensioner comprises a first apertured panel extending across said third portion of said screen filter element on a downstream side of said screen filter element, said first apertured panel sandwiching said screen filter element against a second apertured panel extending across said third portion of said screen filter element on an upstream side of said screen filter element.

11. An equipment enclosure with free-air cooling, comprising:
an equipment enclosure housing defining an interior equipment chamber;
a free air cooling assembly mounted on said equipment enclosure housing;
said free air cooling assembly having an air outlet arranged to deliver air that has passed completely through said free air cooling assembly to inside said interior equipment chamber;
said free air cooling assembly having an air inlet arranged to receive said air from outside said interior equipment chamber;
said free air cooling assembly having an air flow pathway through which said air entering said air inlet must pass to reach said air outlet;
said free air cooling assembly having a primary air filter removably disposed in said air flow pathway, said primary air filter being configured to remove dust from said air;
said free air cooling assembly having an adjustable screen assembly having a screen filter element disposed upstream of said primary air filter in said air flow pathway;
said free air cooling assembly having an adjustment mechanism operable to selectively utilize different regions of said screen filter element for filtering said air passing through said air flow pathway at different times;
said screen filter element being a secondary air filter configured to perform pre-screening to remove large particulates from said air before it reaches said primary air filter while passing said dust to said primary air filter, said large particulates being larger in size than said dust filtered by said primary air filter, thereby extending a useful service life of said primary air filter; and
said free air cooling assembly being operable to receive said air from outside said interior equipment chamber into said air inlet, pass said air through said adjustable screen assembly and said primary air filter via said air flow pathway, and deliver said air that has passed through said adjustable screen assembly and said primary air filter through said air outlet to inside said interior equipment chamber.

12. The equipment enclosure of claim 11, wherein said different regions of said screen filter element include at least a first screen region for filtering said air during a first time period and a second screen region for filtering said air during a second time period.

13. The equipment enclosure of claim 11, wherein said different regions of said screen filter element are selectively utilizable for filtering said air by virtue of said different regions being movable in and out of said air flow pathway.

14. The equipment enclosure of claim 11, wherein said different regions of said screen filter element are movable by virtue of said adjustable screen assembly being indexable.

15. The equipment enclosure of claim 11, wherein said adjustable screen assembly comprises said screen filter element being mounted on a pair of rollers.

16. The equipment enclosure of claim 11, wherein said adjustable screen assembly comprises a source roller having a first portion of said screen filter element wound thereon and a take-up roller having a second portion of said screen filter element wound thereon.

17. The equipment enclosure of claim 16, wherein said source roller and said take-up roller are spaced from each other to define a screen-filtering area wherein a third portion of said screen filter element spans said air-flow pathway.

18. The equipment enclosure of claim 17, wherein said adjustment mechanism comprises a drive mechanism operable to rotate said take-up roller.

19. The equipment enclosure of claim 18, wherein said adjustable screen assembly includes a screen tensioner operable to tension said third portion of said screen filter element.

20. The equipment enclosure of claim 19, wherein said screen tensioner comprises a first apertured panel extending across said third portion of said screen filter element on a downstream side of said screen filter element, said first apertured panel sandwiching said screen filter element against a second apertured panel extending across said third portion of said screen filter element on an upstream side of said screen filter element.

21. A method for controlling temperature in an equipment enclosure using an equipment enclosure free air cooling assembly:
said equipment enclosure comprising an equipment enclosure housing defining an interior equipment chamber;
said free air cooling assembly being mounted on said equipment enclosure housing, and comprising:

an air outlet arranged to deliver air that has passed completely through said free air cooling assembly to inside said interior equipment chamber;

an air inlet arranged to receive said air from outside said equipment enclosure;

an air flow pathway through which air entering said air inlet must pass to reach said air outlet;

a primary air filter removably disposed in said air flow pathway, said primary air filter being configured to filter dust from said air;

an adjustable screen assembly having a screen filter element disposed upstream of said primary air filter in said air flow pathway;

an adjustment mechanism operable to selectively utilize different regions of said screen filter element for filtering said air passing through said air flow pathway at different times; and said screen filter element being a secondary air filter configured to perform pre-screening to remove large particulates from said air before it reaches said primary air filter while passing said dust to said primary air filter, said large particulates being larger in size than said dust filtered by said primary air filter, thereby extending a useful service life of said primary air filter said method comprising:

operating said free air cooling assembly to receive said air from outside said equipment enclosure into said air inlet, pass said air through said adjustable screen assembly and said primary air filter via said air flow pathway, and deliver said air that has passed through said adjustable screen assembly and said primary air filter through said air outlet to inside said interior equipment chamber;

said operating said free air cooling assembly including using a first region of said screen filter element to filter air passing through said air flow pathway during a first time period;

operating said adjustment mechanism to adjust said screen filter element to utilize a second region of said screen filter element in lieu of said first region of said screen filter element; and said operating said free air cooling assembly further including using said second region of said screen filter element to filter air passing through said air flow pathway during a second time period.

\* \* \* \* \*